United States Patent [19]

Walden

[11] Patent Number: 5,130,665
[45] Date of Patent: Jul. 14, 1992

[54] AUDIO VOLUME LEVEL CONTROL

[76] Inventor: Richard L. Walden, 5120 S. Douglad Rd., Oswego, Ill. 60543

[21] Appl. No.: 655,636

[22] Filed: Feb. 14, 1991

[51] Int. Cl.$^5$ ............................................. H03G 3/20
[52] U.S. Cl. ..................................... 330/129; 330/279; 381/104; 381/107; 381/109
[58] Field of Search ................. 330/129, 279; 381/104, 381/107, 109; 455/200

[56] References Cited

U.S. PATENT DOCUMENTS 4,320,254  3/1982  Tottori et al. ......................... 381/109
4,792,977  12/1988  Anderson .............................. 381/104

Primary Examiner—Eugene R. LaRoche
Assistant Examiner—R. A. Ratliff
Attorney, Agent, or Firm—Edmond T. Patnaude

[57] ABSTRACT

An audio volume controller includes a variable gain amplifier which amplifies an audio signal and drives a sound transducer such as a loud speaker. A volume controller is responsive to the level of the audio signal to adjust the gain of the amplifier to maintain the level of sound reproduced by the speaker between manually adjustable minimum and maximum values. A second minimum level control is provided to set a predetermined minimum audio signal level below which the gain of the amplifier is not increased in an attempt to maintain the sound level above the manually adjusted level.

9 Claims, 1 Drawing Sheet

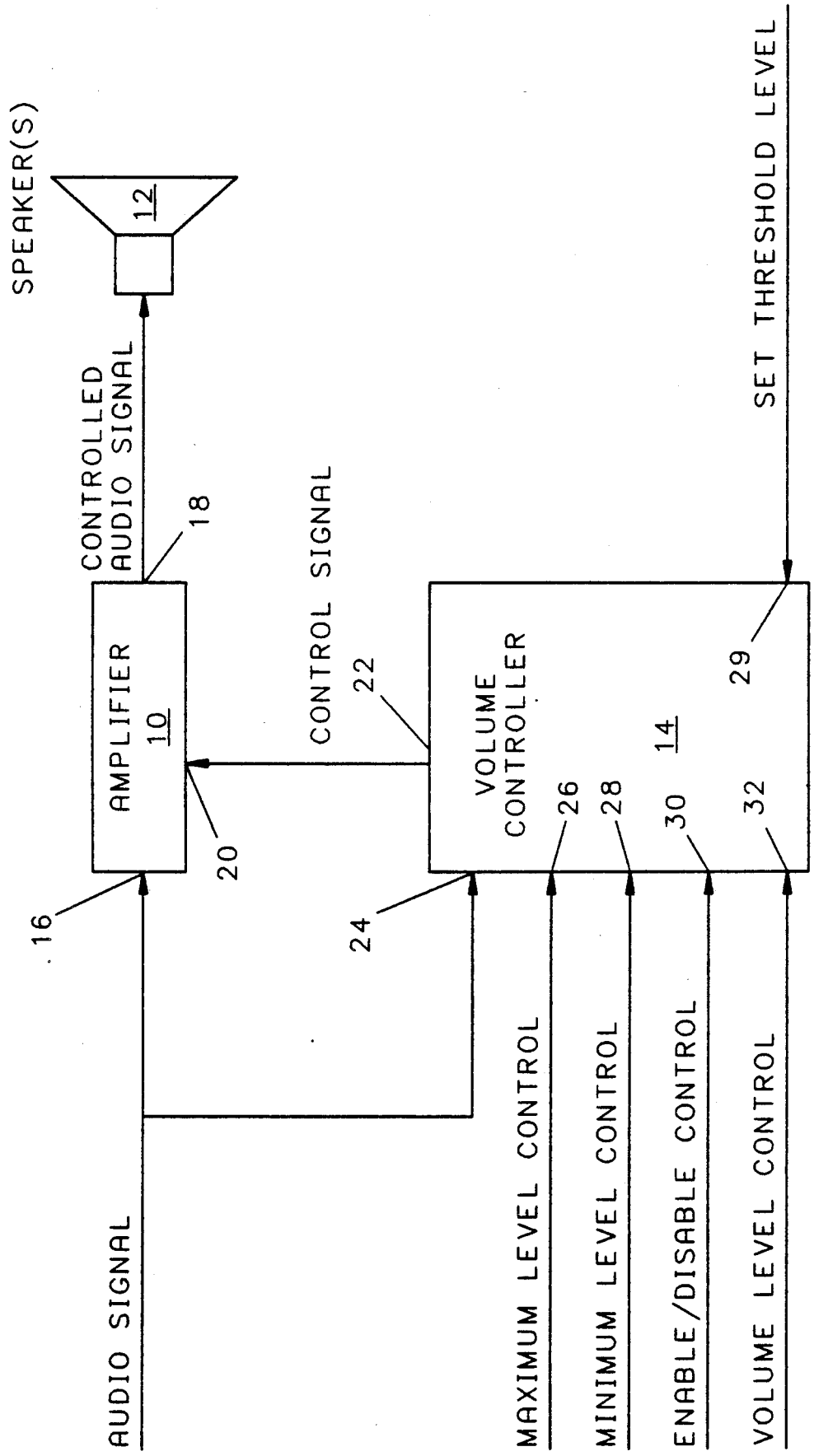

AUDIO VOLUME LEVEL CONTROL

AUDIO VOLUME LEVEL CONTROL

The present invention relates in general to methods and apparatus for controlling the level of sound produced by a loudspeaker or other transducer, and it relates more particularly to a new and improved method and apparatus for maintaining the sound level from a transducer between two adjustable preset levels.

BACKGROUND OF THE INVENTION

The level of the sound produced by radios, television receivers, stereo systems and the like varies over a wide range. For example, gun shots, crowd noise, and commercials frequently result in inordinately load sounds which may be offensive to persons in the vicinity of the loud speakers. On the other hand, the sound level may at times be so low that the person listening to the device cannot hear it. This occurs, for example, where the hearing of the person listening is impaired and the sound being reproduced is a whisper. Simply increasing or decreasing the volume level by adjusting a conventional volume control does not correct for these problems since the normal sound level may then be too low or too high. For example, when the sound level is so low that it cannot be heard, increasing the volume level may increase the average sound level so that it is disturbing to others not desiring to listen to the sound being reproduced. Where, however, the sound level becomes too high, decreasing the volume level of the entire signal may result in the low level sounds not being heard.

SUMMARY OF THE INVENTION

Briefly, there is provided in accordance with the present invention a volume level control method and system wherein the minimum and maximum audio levels can be individually set by the listener so that when the signal level falls below the set minimum level it is amplified to a greater extent than when the signal level is greater than the set minimum level, and when the signal level is greater than the set maximum level, it is amplified to a lesser extent than when its level is below the set maximum level. In this way, persons whose hearing is impaired can hear the low level sounds, such as whispers, without persons in the general area of the loudspeaker being subjected to extremely high volume levels.

In addition to the minimum level control which is adjustable by the listener, there is a threshold level control which may be set at the factory to prevent the amplification of noise when there is no audio signal present. Accordingly, only when the audio signal level is above the set threshold level and below the level set by the minimum level control is the gain of the amplifier increased.

In a preferred embodiment of the invention the minimum and maximum level control circuits are combined with a conventional volume control circuit so that simultaneous adjustment of both the preset minimum and preset maximum sound levels can, when desired, be made by the use of a single volume control.

GENERAL DESCRIPTION OF THE DRAWING

A better and more complete understanding of the present invention may be had from a reading of the following detailed description taken in connection with the accompanying drawing which is a schematic diagram of an audio system embodying the present invention.

DETAILED DESCRIPTION OF A PREFERRED EMBODIMENT

Referring to the drawing, the principal parts of the system may be seen to comprise a variable gain amplifier 10, one or more loud speakers 12, and a volume controller 14. An audio signal is applied to a signal inlet port 16 of the amplifier 10 where it is amplified and coupled from an amplifier outlet port 18 to the inlet terminals of the speaker 12 for conversion to a sound wave. The gain of the amplifier 10 is controlled by a control signal coupled to a control inlet port 20 of the amplifier 10 from the outlet port 22 of the volume controller 14.

The audio signal is split prior to being applied to the signal input port 16 of the amplifier 10, and a part of the audio signal is applied to a signal inlet port 24 of the volume controller 14. Maximum and minimum volume levels are adapted to be adjustably set by the listener by means of a pair of manual controls respectively connected to maximum and minimum input ports 26 and 28 of the volume controller 14. There is provided an additional level control at 29 which is preferably set at the factory which determines the minimum threshold level of the audio signal which will affect the gain of the amplifier 10. When the level of the audio signal applied to the inlet port 24 is less than the level set by the minimum level control 28 but greater than the level set by the threshold control 29, the volume controller 14 is enabled and increases the level of the control signal applied to the amplifier gain control port 20 thereby to increase the gain of the amplifier 10. On the other hand, when the level of the audio signal applied to the inlet port 24 is greater than the level set by the maximum level control, the volume controller 14 decreases the level of the control signal applied to the gain control port 20 to decrease the gain of the amplifier 10 and thus maintain the level of the sound produced by the speaker 12 below the preset maximum level.

In order to permit use of the device to accurately duplicate recorded or transmitted sounds without alteration by the minimum and maximum controls, an enable/disable control is provided which inputs an on/off signal to the volume controller 14 at an input 30 thereof.

In order to facilitate use of the device, a conventional volume level control circuit having an input to the volume controller at 32 is provided. When the enable/disable control is in the disable condition, the volume level controller 14 functions in the normal manner to adjust the average level of the sound produced by the speaker 12. When, however, the enable/disable control is in the enable condition, i.e., the maximum and minimum levels are respectively controlled by the signals at the volume control inputs 26 and 28 and the threshold level control input 29, adjustment of the volume control level simultaneous raises or lowers both the maximum and minimum sound levels produced by the speaker 12.

The volume controller 14 may be a digital microprocessor which compares the signal levels at the respective inputs 24, 26, 28, and 29 thereof to provide the gain control signal at the output port 22 thereof. The audio signal which is split and applied to the inlet ports of the amplifier 10 and the volume controller 14 may be a digital or analog electric signal or it may be an optical signal.

The amplifier 10 and the volume controller 14 may be of the analog type and light responsive, and the audio signal may be a light beam having an intensity varying at the audio frequency to be converted to sound by the speaker 12.

While the present invention has been described in connection with particular embodiments thereof, it will be understood that persons skilled in the art may make many changes and modifications without departing from the true spirit and scope of the invention. Therefore, it is intended by the appended claims to cover all such changes and modifications which come within the true spirit and scope of the invention.

What is claimed is:

1. A method of controlling the level of sound produced by a sound transducer, comprising the steps of
   amplifying an input signal having an amplitude which varies at an audio frequency rate and driving said transducer with the amplified signal to produce sound,
   manually setting a minimum sound level to be produced by said transducer in response to said amplified signal,
   manually setting a maximum sound level to be produced by said transducer in response to said amplified signal independently of said setting of said minimum sound level, and
   controlling the level of amplification of said input signal to maintain the level of sound produced by said sound transducer between said minimum and maximum levels when the audio level of said input signal is above a predetermined threshold value.

2. A method of controlling the level of sound produced by a sound transducer, comprising the steps of
   amplifying an input signal having an amplitude which varies at an audio frequency rate and driving said transducer sound with the amplified signal,
   manually setting the minimum level of sound to be produced by said sound transducer in response to said amplified signal, and
   controlling the level of amplification of said input signal to maintain the level of sound produced by said transducer above said minimum level when the audio level of said signal is above a predetermined threshold value.

3. A method of controlling the level of sound produced by a transducer, comprising the steps of
   amplifying an input signal having an amplitude which varies at an audio frequency rate and driving said transducer with the amplified signal,
   manually setting the maximum level of sound to be produced by said transducer in response to said amplified signal, and
   controlling the level of amplification of said input signal to maintain the level of sound produced by said transducer below said maximum level.

4. A volume controller, comprising in combination
   variable gain amplifier means for amplifying an audio signal,
   sound transducer means responsive to the output of said amplifier means for producing sound corresponding to the amplified audio signal,
   means for setting a minimum audio signal level,
   means for setting a maximum audio signal level,
   means responsive to said audio signal for increasing the gain of said amplifier means when said amplified audio signal is less than said minimum audio signal level, and
   means responsive to said audio signal for decreasing the gain of said amplifier means when said amplified audio signal is greater than said maximum audio signal level.

5. A volume controller according to claim 4, further comprising
   manually settable means for simultaneously setting both said minimum and maximum audio signal levels.

6. A volume controller according to claim 4, further comprising
   manually operable enable/disable means for enabling or disabling said means for setting said minimum and maximum audio signal levels.

7. A volume controller according to claim 4, further comprising
   third means for setting a minimum threshold signal level below which the gain of said variable gain amplifier is not increased when the level of said audio signal falls below said minimum level set by said first means.

8. The method according to claim 1 further comprising the step of
   manually adjusting the sound level produced by said sound transducer between said minimum and maximum sound levels.

9. A volume controller according to claim 4, further comprising
   manually operable means for adjusting the level of said audio signal between said minimum and maximum audio signal levels.

* * * * *